United States Patent [19]

Minorikawa

[11] 4,037,085

[45] July 19, 1977

[54] COUNTER

[75] Inventor: Kazuo Minorikawa, Tokyo, Japan

[73] Assignee: Hitachi, Ltd., Japan

[21] Appl. No.: 715,152

[22] Filed: Aug. 17, 1976

[30] Foreign Application Priority Data

Aug. 27, 1975  Japan .................................. 50-103029

[51] Int. Cl.$^2$ ............................................. H03K 21/36
[52] U.S. Cl. ......................... 235/92 LG; 235/92 PE;
235/92 GT; 235/92 R; 307/220 R
[58] Field of Search ........ 235/92 LG, 92 GT, 92 PE;
328/48, 41; 307/220 R

[56] References Cited

U.S. PATENT DOCUMENTS

| 3,145,293 | 8/1964 | Homan | 235/92 PE |
| 3,632,997 | 1/1972 | Froemke | 235/92 LG |
| 3,634,658 | 1/1972 | Brown | 235/92 LG |

Primary Examiner—Joseph M. Thesz
Attorney, Agent, or Firm—Craig & Antonelli

[57] ABSTRACT

A counter particularly useful for a program counter comprising a plurality of logic units representative of digits of information data being stored in the counter, each logic unit including a flip-flop circuit indicative of the value of each digit, an exclusive OR circuit connected with the input of the flip-flop circuit and an OR circuit connected with an input of the exclusive OR circuit, the output of the flip-flop circuit being connected to another input of the exclusive OR circuit. A control signal and a carry signal are supplied to the inputs of the OR circuit of an associated one logic unit. The least significant digit logic unit lacks an OR circuit since no carry signal is supplied thereto so that a least significant digit control signal is directly supplied to one input of the exclusive OR circuit of the least significant digit logic unit.

2 Claims, 2 Drawing Figures

COUNTER

This invention relates to counters and more particularly to program counters for use in electronic computers.

A program counter is used to address instructions stored in a memory of an electronic computer for the sequential execution of a program. This program counter comprises generally a plurality of flip-flop circuits and has an address increment function. The count of this program counter is incremented orderly when the computer executes a program sequentially without any branching. When branching is required in the course of sequential execution of the program, a branch instruction is applied which may be skip instructions or jump instructions. In response to the application of the skip instructions at the branch point, the count of the program counter is incremented more than orderly, while in response to the application of the jump instructions at the branch point, the count of the program counter is renewed according to the instructions.

In a computer using such a program counter of prior art structure for addressing instructions stored in a memory for the sequential execution of a program, the number of steps skipped in response to the skip instruction has been limited to one step. In some cases, however, it will be convenient for the computer operation when the number of skip steps instructed by the skip instruction can be changed as desired without being always limited to the one step.

As above described, the sequential flow of operations for the execution of a program may be modified by the branch instructions which include the skip instructions and the jump instructions. In the case of the former branching, the destination address need not be incorporated in the instruction words since the number of skip steps is always limited to one step as pointed out above. In the case of the latter branching, the destination address may be freely selected, but it is necessary to store such destination address in the memory. Further, it is necessary to define the label of this destination address when the assembler language is used to compose the program. 8 bits, 16 bits or more are generally required to direct the jump destination address, resulting in an undesirable increase of the length of the instruction word.

It is therefore demanded that the number of program steps instructed to skip by the skip instructions can be changed as desired without being always limited to one step, thereby permitting skipping over a predetermined number of steps without resorting to the jump instructions which are required to direct the destination address to be completely stored in the computer memory, so as to permit efficient utilization of the computer memory and to provide desired versatility of the skip instructions in the assembler program.

With a view to meet such demand, it is a primary object of the present invention to provide a novel and improved counter of simple construction which can advance the count by $2^n$ ($n$: 0, 1, 2, ... ) at a high speed.

The present invention which attains the above object provides a multi-digit counter including a plurality of flip-flop circuits connected in cascade in which a gate circuit is disposed on the input of the logic unit for each digit and a count control signal is supplied to any desired one of the logic unit for any digit through the associated gate circuit so as to increment the count by, for example, $2^n$ ($n$: 0, 1, 2, ... ).

Other objects and advantages of the present invention will be clear from the following description made on a preferred embodiment referring to the accompanying drawings, in which.

Figure 1:
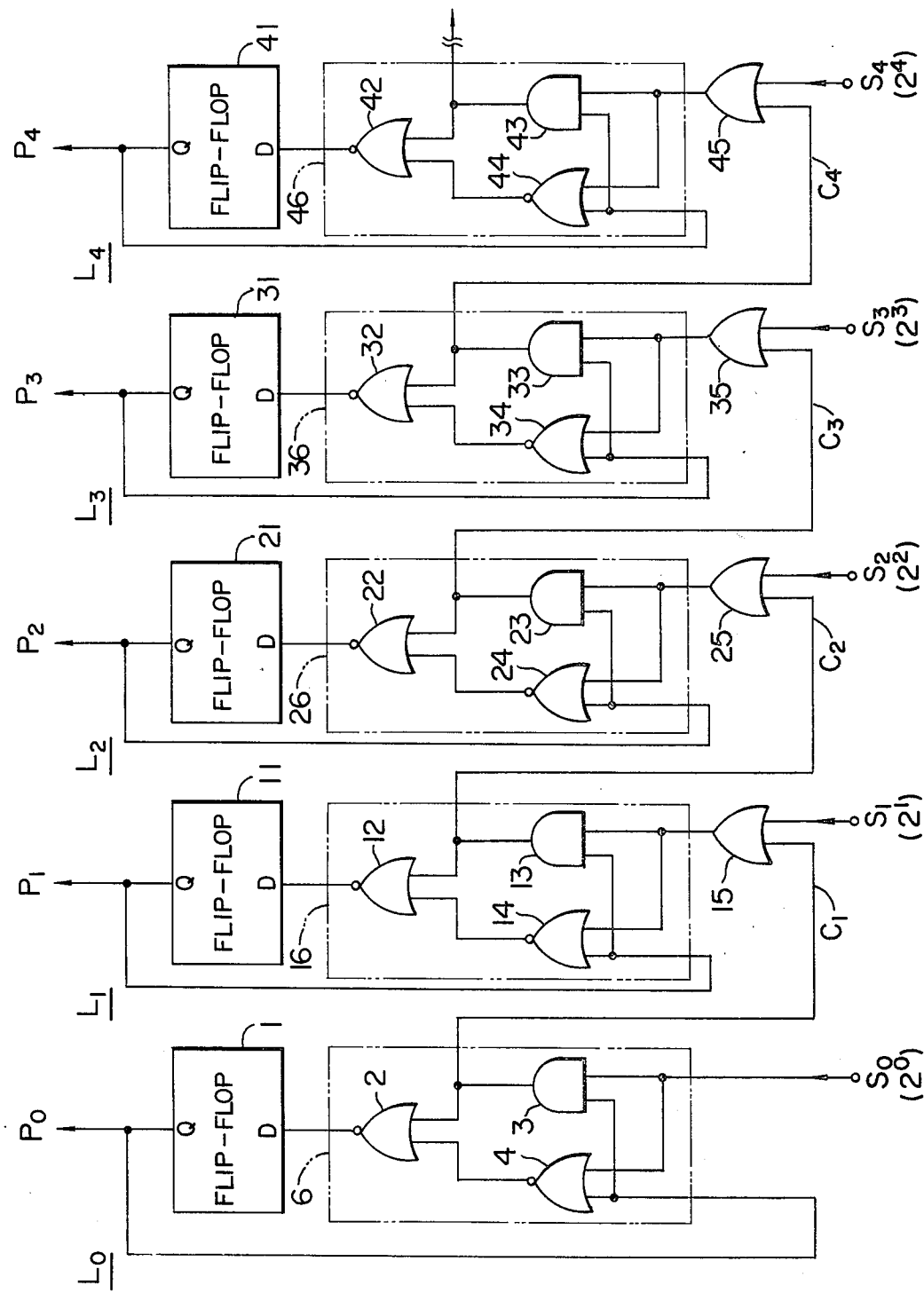
FIG. 1 is a diagram showing an embodiment of the present invention.

Referring to FIG. 1, the counter comprises a plurality of logic units, here five logic units $L_0$ to $L_4$ representative of digits of information data being stored in the counter. The logic unit $L_0$ representative of the least significant digit includes a flip-flop circuit 1 and an exclusive OR circuit 6 which drives the flip-flop circuit 1. A counter control signal $S_0$ may be supplied to one of two input terminals of the exclusive OR circuit 6, and the output of the flip-flop circuit 1 is supplied to the other input terminal of the exclusive OR circuit 6. The logic unit $L_1$ representative of the next higher order digit includes a flip-flop circuit 11, an exclusive OR circuit 16 driving the flip-flop circuit 11, and an OR circuit 15 connected with one of two input terminals of the exclusive OR circuit 16. The output of the flip-flop circuit 11 is supplied to the other input terminal of the exclusive OR circuit 16. Another count control signal $S_1$ may be supplied to one of two input terminals of the OR circuit 15, and a carry signal $C_1$ from the logic unit $L_0$ representative of the next lower order digit is supplied to the other input terminal of the OR circuit 15. The remaining logic units $L_2$, $L_3$ and $L_4$ have a structure entirely similar to that of the logic unit $L_1$.

The exclusive OR circuit 6 in the logic unit $L_0$ includes a first NOR circuit 4, and AND circuit 3, and a second NOR circuit 2. The output of the flip-flop circuit 1 and the count control signal $S_0$ are supplied in common to the two input terminals of both the first NOR circuit 4 and the AND circuit 3, and the outputs of these circuits 3 and 4 are supplied to the respective input terminals of the second NOR circuit 2. The output of the second NOR circuit 2 provides the output of the exclusive OR circuit 6 and is supplied to the flip-flop circuit 1 to drive the same. The output of the AND circuit 3 provides the carry signal $C_1$ which is supplied to one input terminal of the OR circuit 15 in the logic unit $L_1$ representative of the next higher order digit.

The exclusive OR circuits 16, 26, 36 and 46 in the remaining logic units $L_1$, $L_2$, $L_3$ and $L_4$ are the same in structure and operation as the exclusive OR circuit 6 in the logic unit $L_0$, except for the difference described below. That is, in these logic units $L_1$, $L_2$, $L_3$ and $L_4$, the common inputs supplied to first NOR circuits 14, 24, 34, 44 and AND circuits 13, 23, 33, 43 other than those supplied from the outputs of the flip-flop circuits 11, 21, 31, 41 are provided by the outputs of the OR circuits 15, 25, 35 and 45 which receive carry signals $C_1$, $C_2$, $C_3$, $C_4$ and count control signals $S_1$, $S_2$, $S_3$, $S_4$. That is, the carry signals $C_1$, $C_2$, $C_3$ and $C_4$ from the individual logic units $L_0$, $L_1$, $L_2$ and $L_3$ are supplied respectively from the output terminals of the AND circuits 3, 13, 23 and 33 to the logic units $L_1$, $L_2$, $L_3$ and $L_4$ representative of successively higher order digits.

It is to be noted that, in the counter construction according to the present invention, an exclusive OR circuit and an OR circuit are disposed at the input side of a flip-flop circuit in each of a plurality of logic units representative of digits of information data, except that such OR circuit is not provided in the logic unit representative of the least significant digit, and a count control signal may be supplied to the any logic unit. It is to be noted further that the individual logic units are connected in cascade so that carry signals from the logic units representative of lower order digits can be detected.

The output of the flip-flop circuit 1 in the logic unit $L_0$ is inverted when a count instruction (P + 1) is executed, where P represents the count of the counter just before the execution of the instruction. That is, the output of the flip-flop circuit 1 is inverted when the count control signal $S_0$ is supplied to the logic unit $L_0$. The output of the flip-flop circuit 11 in the logic unit $L_1$ is inverted when the output of the flip-flop circuit 1 in the logic unit $L_0$ is 1 and the count construction (P + 1) is executed, or when another count instruction (P + 2) is executed by supplying the count control signal $S_1$ to the logic unit $L_1$.

The conditions for inverting the state of the flip-flop circuits 1 and 11 in the respective logic units $L_0$ and $L_1$ are given by the following logical expressions:

$$P_0' = (P + S_0)$$
$$P_1' = (P + S_0) \cdot P_0 + (P + S_1)$$
$$= P_0' \cdot P_0 + (P + S_1)$$

Similarly, the conditions for inverting the state of the flip-flop circuits 21, 31 and 41 in the respective logic units $L_2$, $L_3$ and $L_4$ are expressed as $$P_2' = P_1' \cdot P_1 + (P + S_2)$$
$$P_3' = P_2' \cdot P_2 + (P + S_3)$$
$$P_4' = P_3' \cdot P_3 + (P + S_4)$$
$$\vdots$$
$$P_n' = P_{n-1}' \cdot P_{n-1} + (P + S_n)$$

In the above expressions, $(P + S_0)$ to $(P + S_4)$ represent the count instructions, $P_0$ to $P_3$ represent the states of the individual flip-flop circuits 1, 11, 21 and 31 before execution of the count instructions, and $P_0'$ to $P_4'$ represent the states of the individual flip-flop circuits 1, 11, 21, 31 and 41 after execution of the count instructions.

It is therefore possible to increment the count of the counter by $2^n$ (n: 1, 2, 3, ...). For example, (P + 1) can be executed by supplying the count control signal $S_0$ to the logic unit $L_0$ representative of the digit place $2^0$. Similarly, (P + $2^1$) can be executed by supplying the count control signal $S_1$ to the logic unit $L_1$ representative of the digit place $2^1$, and (P + $2^2$) can be executed by supplying the count control signal $S_2$ to the logic unit $L_2$ representative of the digit place $2^2$.

It will be seen that the flip-flop circuit 1 associated with the digit place $2^0$ is necessarily inverted in adding 1 (= $2^0$) to the count of the counter. The state of the flip-flop circuit 11 associated with the digit place $2^1$ is inverted only when the flip-flop circuit 1 associated with the digit place $2^0$ is in the state 1 before being inverted. The state of the flip-flop circuit 21 associated with the digit place $2^2$ is inverted only when the flip-flop circuits 1 and 11 associated respectively with the digit places $2^0$ and $2^1$ are both in the state 1 before being inverted. The state of the flip-flop circuit 31 associated with the digit place $2^3$ is inverted only when the flip-flop circuits 1, 11 and 21 associated respectively with the digit places $2^0$, $2^1$ and $2^2$ are all in the state 1 before being inverted. The same applies to the flip-flop circuit 41 associated with the digit place $2^4$.

According to the general principle of the present invention, the state of a flip-flop circuit associated with a digit place $2^i$ is necessarily inverted in incrementing the count of the counter by $2^i$, and flip-flop circuits associated with digit places not higher than the digit place $2^{i-1}$ are kept in the existing state. In regard to flip-flop circuits associated with digit places not lower than the digit place $2^{i-1}$, the state of any one of such flip-flop circuits is inverted only when the flip-flop circuits associated with the digit places ranging from the digit place $2^i$ to the digit place next lower than that of its own are all in the state 1. Such manner of inversion of flip-flop circuits can be simply attained by a logic circuit structure which satisfies the conditions provided by the logical expressions described hereinbefore.

It will be understood from the foregoing description of the present invention that unique instructions can be produced by hardware means due to the fact that the number of skip steps is not limited to one but can be freely selected to be $2^n$ (2: 1, 2, 3, ...).

Although an application of the present invention to a program counter has been described by way of example, the present invention is in no way limited to such specific application and is applicable to all sorts of systems including a counter required to add $2^i$ to the count thereof.

Figure 2:
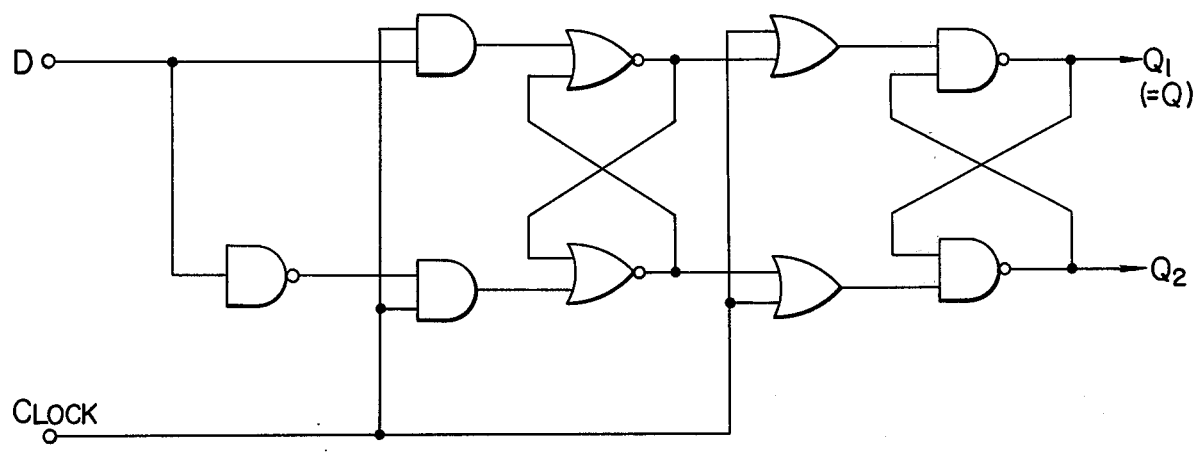
FIG. 2 is a diagram showing an example of the flip-flop circuit which may be used in the embodiment of FIG. 1.

FIG. 2 shows an example of a flip-flop circuit which may be used as each of the flip-flop circuits 1, 11, 21, 31 and 41. The truth table for the flip-flop circuit is as shown below.

| CLOCK | $(Q_1)_{n+1}$ | $(Q_2)_{n+1}$ |
|---|---|---|
| 1 | $(Q_1)_n$ | $(Q_2)_n$ |
| 0 | $D_{n+1}$ | $\overline{D}_{n+1}$ |

Thus, it is clear that the output $Q_1$ be used when the flip-flop circuit is used in the embodiment of FIG. 1.

I claim:

1. A counter comprising a plurality of logic units each representative of one of the digits of information data being stored in the counter, each said logic unit except that representative of the least significant digit including an OR circuit having an input terminal for receiving a control input signal for the associated digit, an exclusive OR circuit having an input terminal connected with the output of said OR circuit and a flip-flop circuit having an input terminal connected with the output of said exclusive OR circuit, the output of said flip-flop circuit being indicative of the value of the associated digit, said exclusive OR circuit having another input terminal connected with the output of said flip-flop circuit, the logic unit representative of the least significant digit including another exclusive OR circuit having an input terminal for receiving a control input signal for the least significant digit and another flip-flop circuit having an input terminal connected with the output of said another exclusive OR circuit, the output of said another flip-flop circuit indicative of the value of the least significant digit, said another exclusive OR circuit having another input terminal connected with the output of said another flip-flop circuit, the OR circuit of each of said logic units having another input terminal to which a carry signal from the logic unit representative of the next lower order digit is supplied.

2. A counter according to claim 1, in which said exclusive OR circuit of each said logic circuit except that representative of the least significant digit includes a first NOR circuit, an AND circuit and a second NOR circuit, each of said first NOR circuit and AND circuit receiving both of the outputs of said OR circuit and flip-flop circuit, said second NOR circuit having inputs connected with the outputs of said first NOR circuit and AND circuit, the output of said AND circuit being connected with said another input terminal of the OR circuit of the logic circuit representative of the next higher order digit, the output of said second NOR circuit being the output of said exclusive OR circuit, the exclusive OR circuit of the logic unit representative of the least significant digit includes another first NOR circuit, another AND circuit and another second NOR circuit, each of said another first NOR circuit and another AND circuit receiving both of said control input signal for the least significant digit and the output of said another flip-flop circuit, said another second NOR circuit having inputs connected with the outputs of said another first NOR circuit and another AND circuit, the output of said another AND circuit being connected with said another input terminal of the OR circuit of the logic unit representative of the next higher order digit, the output of said another second NOR circuit being the output of the exclusive OR circuit of the least significant digit logic unit.

* * * * *